United States Patent [19]

Matthews

[11] Patent Number: 4,499,601

[45] Date of Patent: Feb. 12, 1985

[54] METHOD AND APPARATUS FOR AUTOMATICALLY DETECTING AND PLAYING DESIRED AUDIO SEGMENTS OVER A BROADCAST RECEIVER.

[76] Inventor: Gordon H. Matthews, 2428 Trellis, Plano, Tex. 75075

[21] Appl. No.: 434,868

[22] Filed: Oct. 18, 1982

[51] Int. Cl.³ .......................... H03J 7/18; H04B 1/16
[52] U.S. Cl. .................................. 455/166; 455/184; 455/186; 455/2
[58] Field of Search ............... 455/2, 67, 161, 166, 455/184–186; 381/41–43, 110

[56] References Cited

U.S. PATENT DOCUMENTS

| | | | |
|---|---|---|---|
| 3,760,275 | 9/1973 | Ohsawa et al. | 455/2 |
| 3,919,479 | 11/1975 | Moon et al. | 455/67 |
| 4,063,031 | 12/1977 | Grunza | 381/43 |
| 4,230,990 | 10/1980 | Lert, Jr. et al. | 455/67 |
| 4,450,531 | 5/1984 | Kenyon et al. | 455/2 |

Primary Examiner—Jin F. Ng
Attorney, Agent, or Firm—Jerry W. Mills; Gregory M. Howison; Nina L. Medlock

[57] ABSTRACT

The specification discloses a method and apparatus for detecting and playing desired audio segments over a broadcast receiver such as a radio or television. Apparatus is coupled with the broadcast receiver (30) to enable the listener to listen to any of a plurality of different stations and to select desired audio segments being played on any of the stations. Apparatus (46) is provided to store the selected desired audio segments selected by the listener. Apparatus (50) scans the audio being broadcast by each of a plurality of different stations. Apparatus (48) compares the selected desired audio segments with the audio scanned. In response to the comparison, the desired audio segments are played over the broadcast receiver upon occurrence of the desired audio segments on any of a plurality of different stations.

32 Claims, 9 Drawing Figures

METHOD AND APPARATUS FOR AUTOMATICALLY DETECTING AND PLAYING DESIRED AUDIO SEGMENTS OVER A BROADCAST RECEIVER.

TECHNICAL FIELD

This invention relates to a broadcast receiver, and more particularly relates to a method and apparatus for detecting and playing desired audio segments over a broadcast receiver such as a radio or television set.

BACKGROUND OF THE INVENTION

With the advent of modern broadcast receivers such as radio and television, a wide variety of program material is continually broadcast over a wide range of different stations. These stations are detected by a large number of broadcast receivers located in automobiles, homes, offices and the like. This wide proliferation of program material has provided a wide variety of listening material, but has also made it difficult for the listener to hear specific desired audio segments.

For example, listeners often develop a fondness for certain musical compositions or songs, but are unable to hear such songs more than a few times each day. Due to the large number of stations available, it is not practical to continually tune the broadcast receiver in order to hear such favorite songs. Similarly, it is often difficult to locate and hear news broadcasts or other programs involving particular personalities.

A need has thus arisen for a method and system to enable a listener to hear desired audio segments whenever the segments are broadcast, no matter on which station they are occurring. Such a system would require the flexibility of enabling the listener to select any desired audio segment to be subsequently played, whether it be a song, musical composition, news broadcast or the like. Thereafter, it would be desirable for the broadcast receiver to automatically detect the occurrence of the desired audio segment and play it for the listener's enjoyment.

SUMMARY OF THE INVENTION

In accordance with the present invention, apparatus is coupled with a broadcast receiver in order to detect and play desired audio segments selected by the listener. Electronic circuitry is coupled to the receiver to enable the listener to select desired audio segments the listener wishes to hear. The occurrence of one of the desired audio segments is then detected on any of a plurality of radio stations being received by the receiver. In response to the detection of the desired audio segment, the desired audio segment is then broadcast over the receiver for the enjoyment of the listener. After broadcast of the audio segment, the receiver automatically retunes to the last station listened to.

In accordance with another aspect of the invention, a system is provided to detect and play desired audio segments over a broadcast receiver which can receive and broadcast audio programs from a plurality of different stations. The listener selects desired audio segments the listener wishes to subsequently hear. Representations of these selected desired audio segments are stored in a memory. The audio being broadcast by each of the plurality of different stations is continuously scanned for content. The stored representations of desired audio segments are compared with the audio being scanned. In response to a favorable comparison, a desired audio segment is played over the broadcast receiver upon occurrence on any of the plurality of different stations. In this way, the listener may select and hear a favorite song, no matter which station in the receiving range of the broadcast receiver the song is currently being played on.

BRIEF DESCRIPTION OF THE DRAWINGS

For a more complete understanding of the present invention and the advantages thereof, reference is now made to the following description taken in conjunction with the accompanying drawings in which.

DESCRIPTION OF THE PREFERRED EMBODIMENT

Figure 1:
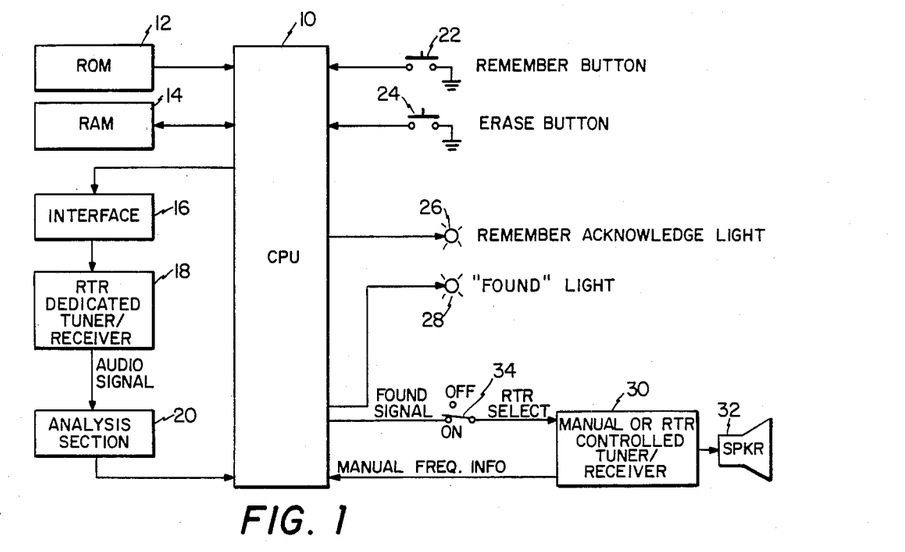
FIG. 1 is a block diagram of the preferred embodiment of the invention.

Referring to FIG. 1, the present system includes a digital CPU 10 which is interconnected with a read only memory (ROM) 12 and a random access memory (RAM) 14. An interface 16 connects a dedicated radio tuner/receiver 18 and an analysis section 20 to the CPU 10. A "remember" button 22 is connected between circuit ground and the CPU. An "erase" button 24 is connected between circuit ground and the CPU 10. A "remember acknowledge" light 26 is connected to an output of the CPU and light 26 is energized in order to indicate an audio segment has been stored by the system, as will be subsequently described. A "found" light 28 is connected to the output of CPU 10 and is energized when a stored audio segment is detected. A conventional radio tuner/receiver 30, such as a car radio, is interconnected to the output of the CPU and is operated in accordance with the CPU in a manner to be subsequently described. Audio messages are broadcast in the conventional manner from a speaker 32 connected to the tuner/receiver 30.

In operation of the system shown in FIG. 1, the tuner/receiver 30 may be operated in the well-known manner in order to broadcast audio messages such as music, news, sports and many other types of audio messages. The tuner/receiver 30 may, for example, be located within an automobile, may comprise a home radio, or may comprise other types of broadcast receivers such as televisions or the like. The present device is useful with a wide variety of broadcast receivers wherein it is desired to automatically detect and play desired audio segments.

If the automatic detection and play feature of the present invention is desired, a switch 34 is moved from the "off" position to the "on" position. This actuates the "radio that remembers" function, hereinafter termed the "RTR" function. When the RTR function is selected, the listener may listen to the broadcast receiver in the normal manner. In one mode of operation, when the listener hears the first part of a particular audio message, such as a song which he desires to have remembered, the "remember" button 22 is depressed by the listener. The CPU 10 operates to apply the initial portion of the song to the analysis section 20, then converts the analyzed initial portion of the song to a digitized format and stores the digitized audio segment in RAM 14, and light 26 is energized. Thereafter, the RTR dedicated tuner/receiver 18 automatically monitors various stations being received by the tuner/receiver 30.

The audio signals generated from receiver 18 are applied through the analysis section 20 which continually analyzes the audio signals generated from receiver 18. The output from the analysis section 20 is applied to the CPU 10 which compares the output of the analysis section 20 with the stored signals in RAM 14 which were generated as a result of depression of the "remember" button 22. When the CPU 10 determines a match between the output of analysis section 20 and the information stored in RAM 14, a "found" signal is generated, light 28 is energized, and signals are applied to the RTR select input of the tuner/receiver 30. The RTR select signals control the tuner in order to tune the receiver to the desired station such that the desired musical composition is played over the speaker 32. After playing of the desired song, the analysis section 20 determines the end of the song or beginning of the next song and the receiver 30 is returned back to the original station. When the user is listening to a song selected by the system and it is desired to erase an audio segment previously stored in the system, the "erase" button 24 may be depressed. If the user is listening to the regular radio station without utilization of the present system, depression of button 24 erases all preselected song selections.

Hence, with the use of the present invention, the listener of a radio may select the beginning of one or more favorite audio segments such as musical compositions, sports or news shows, by operation of the "remember" button 22. The system stores these desired audio segments and continually searches the broadcast stations to determine when the segments again occur. Upon detection of the segments, the full audio segments are automatically broadcast over the speaker 32 (or directed to a tape recorder or other peripheral equipment). The listener is thus assured of hearing his favorite song, for example, no matter on which station the song occurs. As will be subsequently described, a series of songs or other audio segments may be stored by the present system such that the system automatically plays and automatically broadcasts any of the desired audio segments, regardless of which station the receiver is tuned.

Figure 2:
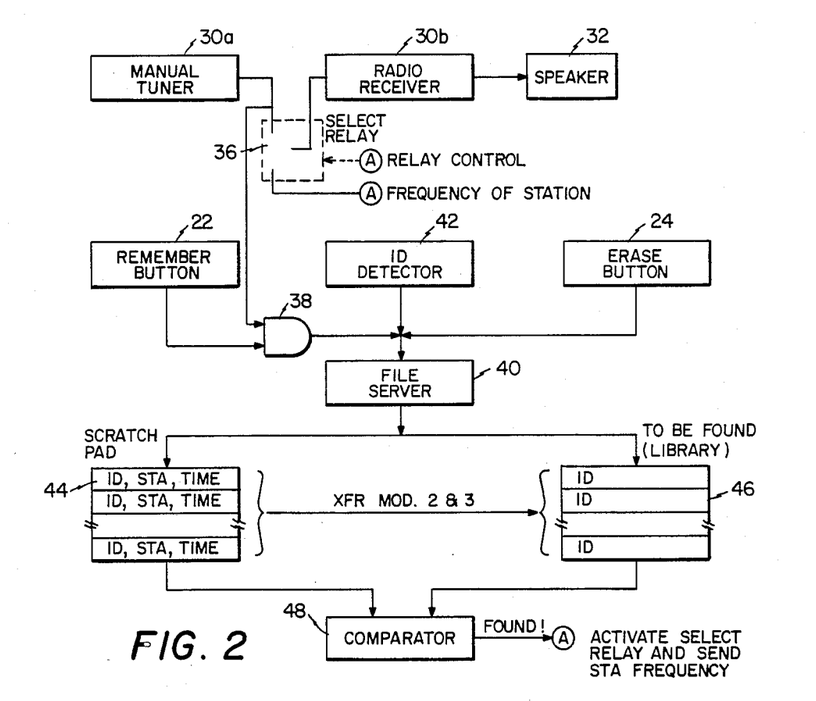
FIG. 2 is an electronic block diagram illustrating the present system in greater detail.

FIG. 2 illustrates in greater detail portions of the system shown in FIG. 1, with like numbers being utilized for like and corresponding parts previously identified. As shown in FIG. 2, a conventional manual tuner 30a is associated with the radio receiver 30b which may comprise any suitable broadcast receiver, as previously noted. Tuner 30a and receiver 30b include a digital tuner which may tune receiver 30b to any desired station in response to digital tuning signals. The audible sound from the radio receiver 30b is broadcast over the speaker 32. A select relay is connected between the manual tuner 30a and the radio receiver 30b and is utilized to transmit digital tuning signals to the radio receiver 30b to tune the receiver to a different station in order to broadcast a desired audio segment.

The output of the manual tuner 30a is applied as an input to an AND gate 38. The output of the "remember" button 22 is also applied as an input to the AND gate 38. The output of gate 38 is applied to a file server 40, along with an input from an ID detector 42 and the input from the "erase" button 24. Depression of button 22 causes digital representations of the frequency of the station currently broadcast by receiver 30b to be sent to file server 40. This information is transmitted along with data from ID detector 42. The output of the file server 40 is applied to a scratch pad memory 44 and to a "to be found" library memory 46. The outputs of memories 44 and 46 are applied to a comparator 48. The output of comparator 48 is utilized to activate the select relay 36 and to transmit a digital station frequency via the select relay to the radio receiver 30b in order to cause the desired audio segment to be played over the speaker 32. Data from the scratch pad memory 44 may be transferred, under the control of the CPU 10 shown in FIG. 1, to the "to be found" library memory 46, as will be subsequently described.

While the gate 38, ID detector 42, file server 40, memories 44 and 46, and comparator 48 are illustrated as discrete circuits in FIG. 2 for clarity of description, it will be understood that most of the functions of these circuits will normally be performed by the CPU 10, as will subsequently be described in greater detail.

Figure 3:
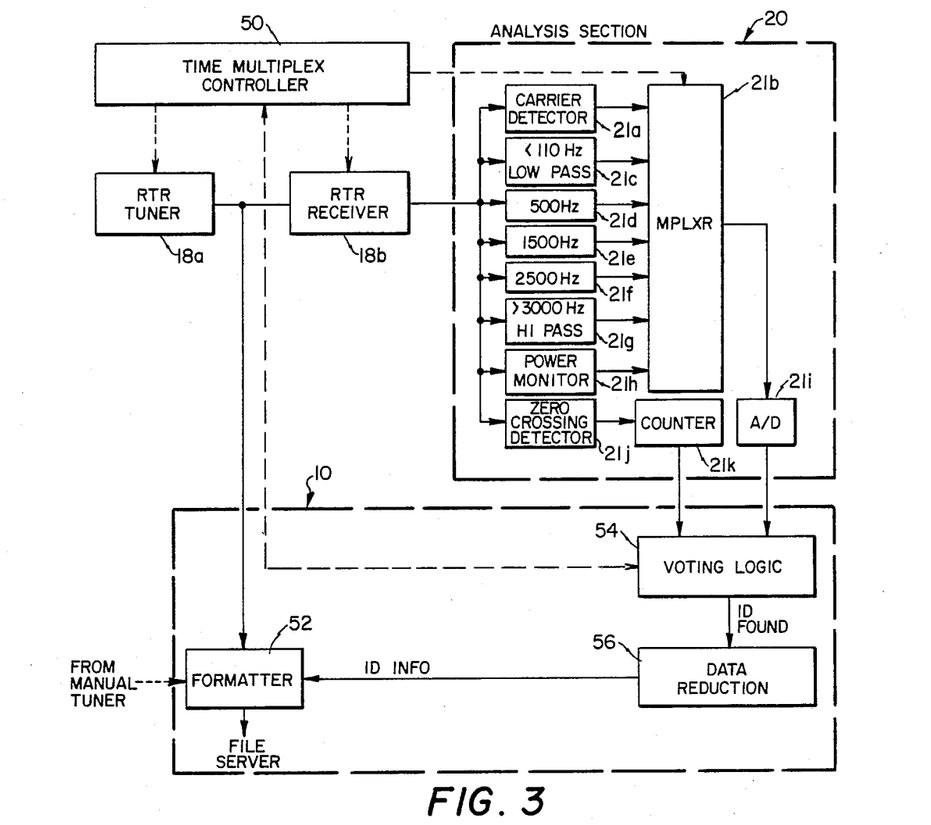
FIG. 3 is a block electronic diagram of the ID detector shown in FIG. 2.

FIG. 3 illustrates in additional detail the ID detector 42 shown in FIG. 2. A time multiplex controller 50 operates to control the RTR tuner 18a and RTR receiver 18b, previously described. The output from tuner 18a is applied directly to a formatter 52 which digitizes the signals, along with the output from data reduction 56, and then applies a controlled output to the file server 40, previously noted. The output from the AND gate 38 from the manual tuner is also applied to the formatter 52.

The output from the dedicated RTR receiver 18b is applied to an analysis section 20 previously described. The analysis section 20 operates upon the output of the RTR receiver 18b in order to analyze audio segments for storage of certain ID characteristics or "fingerprints" and also analyzes later audio segments for comparison with a stored ID in order to detect and play a desired audio segment. It will be understood that different audio segments will have different "fingerprints" due to the difference in frequency components, amplitude of the various frequency components and variations in time in frequency and amplitude. The analysis section includes numerous circuits detecting various aspects of an audio signal. For example, the analysis section 20 includes a carrier detector 21a which detects the presence of a radio carrier signal. The output of the carrier detector is applied to a multiplexer 21b which is controlled by the time multiplexer controller 50. The audio signals from the receiver 18b are also applied to a series of bandpass filters 21c–21g. For example, bandpass filter 21c passes low frequency signals below 120 Hz. Bandpass filter 500 Hz passes only signals within a small bandpasss centered around 500 Hz. Filter 21e passes only a narrow bandpass centered around 1500 Hz, while filter 21f passes only a small bandpass filter around 2500 Hz. The high pass filter 21g passes only frequencies above approximately 3000 Hz.

In addition, a power monitor 21h detects the audio signals and generates an output proportional to the power of the detected signal. The outputs from the circuits 21a–21h are applied to the multiplexer 21b which provides a multiplexed signal. This signal is passed through an analog to digital converter 21i in order to generate a digital signal for application to the voting logic 54, to be subsequently described.

In addition, the audio signal is applied to a zero crossing detector 21*j* which generates indications of zero crossings. These zero crossings are counted by a counter 21*k* and the number of zero crossings are applied to the voting logic 54.

It will be seen that the various parameters detected by the circuits of the analysis section 20 provide valuable input as to whether or not a song is being played, whether voice is occurring or whether silence is occurring on the radio station. These parameters are applied to the voting logic 54 in order to enable detection of the start and ending of songs.

The present system utilizes conventional circuitry for the performance of the various desired functions in the analysis section 20. It will be understood that the present system may be utilized to automatically record desired songs with the use of selective operation of a tape recorder or a recorder. In such case, the radio output would be directed to the recorder rather than to the radio speaker. The term broadcast will thus be understood to mean actual broadcast over the radio speaker or broadcast to a tape recorder or other peripheral device attached to the radio. In use with the present invention, for example, a tape recorder might be attached during the day, and when the user returns, his favorite songs have been recorded for his enjoyment. The system utilizes conventional digital formatting and storage techniques long used in numerous digital computer environments.

The outputs of the analysis section 20 are applied to a conventional voting logic circuit 54 which generates an ID "found" signal only if a predetermined probability of an ID has occurred. Circuit 54 thus eliminates false detection of audio signals caused by static, weak signals and the like. The output of the voting logic 54 is applied to a data reduction circuit 56 wherein the data is compressed and then applied to the formatter 52 for application as a digital signal to the file server 40. The functions of formatter 52, voting logic 54 and data reduction 56 will normally be performed by the CPU 10.

Figure 4:
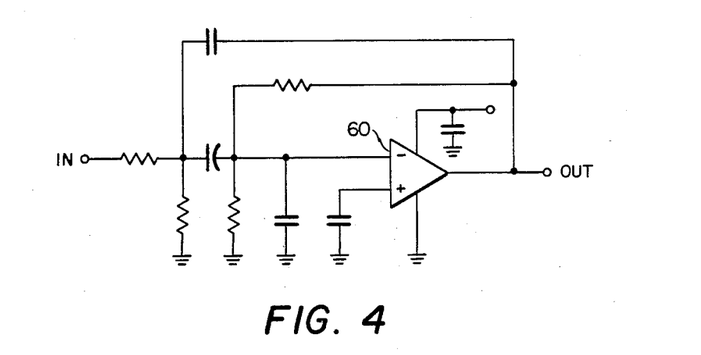
FIG. 4 is an electrical schematic of a portion of the analysis section shown in FIG. 3.

FIG. 4 illustrates a conventional bandpass filter which may be tuned by selection of capacitor and resistance values in order to detect different frequency portions. A plurality of circuits such as shown in FIG. 4 may be connected in parallel and utilized in analysis section 20 to provide the desired frequency analysis. The bandpass filter illustrated in FIG. 4 utilizes a differential amplifier 60 which is manufactured and sold by various electronic manufacturers. The bandpass filters thus enable a time varying "fingerprint" of the first few notes of a song to be generated. This fingerprint is stored as an ID which is later used to again recognize the same song.

The present system as specifically illustrated in FIGS. 2 and 3 may be operated in at least three different modes. In Mode 1, the operator is required to quickly push the "remember" button 22 in order to remember an audio segment which is currently being broadcast on a particular station. Thereafter, the system will search for the remembered audio segment on all stations and will automatically play the full song or musical composition which occurs after the remembered audio segment.

In Mode 2, the system continuously remembers for a predetermined period of time the audio being broadcast over a particular station being listened to. If the listener hears a song he wishes to remember, the listener may then push the "remember" button and the system will store the ID for the song which has just been heard. The second mode of operation does not then require the quick action by the listener in depressing the "remember" button for that period. In this mode, if the listener turns to another station, time must lapse for this mode to operate, inasmuch as the system is only temporarily storing the station being listened to.

In Mode 3 of operation, the system is continuously scanning all radio stations being received by the receiver and stores for a limited period of time all ID's from all songs being played on all stations. Therefore, the listener may turn to any station at any time and may hit the "remember" button without any time lapse and still store a previously played ID.

Other techniques for storing "fingerprints" or ID's for songs and the like will be apparent. For example, it is anticipated that broadcast stations will utilize the capabilities provided by the present system to assist in loading various song ID's. The announcer on the broadcast station would indicate that a series of ID loading segments were about to be played. The listener then depresses the "remember" button 22 and the announcer would then play a series of short segments of songs which would be stored in the system as "ID's". It is possible with the use of various tone coding to store various sequences of songs, such as the top ten country and western songs, the top ten rock and roll songs or the top ten contemporary songs. These ID's could be quickly loaded into the present system with a touch of button 22 and thereafter the listener would automatically hear the programmed top ten songs whenever they were played, regardless of which station the songs were played upon. In such instances the CPU 10 is programmed to play the songs in the order of priority loaded, such that if one "remembered" song was being played, that song would be finished before another "remembered" song was played. This type of prohibition is programmed into the CPU in order to prevent interruption before a desired song is fully played. In case of simultaneous playing of two remembered songs on two different stations, the priority in which the songs were loaded would be utilized to determine which song would be played.

The operation of the present system will now be described with respect to the previously described Mode 1 with reference to FIGS. 2 and 3. In operation, the switch 34 has been placed in the "on" position such that the RTR functions will be provided by the system. The radio receiver 30*b* is operating on a selected station and audible signals are being broadcast to the listener via the speaker 32. If the listener hears a song, sportscast, newscast or the like which he desires to be replayed, the listener then depresses within a predetermined period of time the "remember" button 22. This causes the AND gate 38 to pass the station data from the manual tuner 30*a* to the formatter 52 (FIG. 3) in the ID detector 42.

Simultaneously with the pressing of the "remember" button 22, the RTR tuner 18*a* is tuned under the control of CPU 10 to the same station being tuned to by the manual tuner 30*a*. The RTR receiver 18*b* is then listening to the same station being listened to by the radio receiver 30*b*. The output of the station is being applied to the analysis section 20. The audio signals from the listened station are then analyzed by the various bandpass filters and the like in the analysis section 20. The outputs from these analysis circuits are applied to the voting logic 54. Assuming that the listener depressed the "remember" button 22 concurrently with the playing of a proper ID, the voting logic 54 indicates an "ID found" which is compressed by the data reduction circuit 56 and applied to the formatter 52. Upon receiving an indication of the station on the manual tuner 30a and upon receiving a compressed ID, the formatter 52 applies a signal to the file server 40 in properly formatted digital configuration. The ID signal is then applied to the "to be found" library memory 46 for storage.

Thereafter, the time multiplexer controller 50 operates the RTR tuner 18a in order to constantly search the audio outputs of the stations within the range of the tuner 18a. Multiplexed outputs of the detected stations are then transmitted from the RTR receiver 18b to the analysis section 20. Analysis section 20 applies analyzed signals to the voting logic 54 which determines if similar ID's have been detected, and if so, applies the ID's through the data reduction 56 to the formatter 52. The station frequency is also applied to each determined ID at formatter 52. The various ID's detected as a result of this multiplexing are temporarily stored in the scratch pad memory 44. The ID's stored in the scratch pad memory 44 and the ID's previously stored in the "to be found" library memory 46 are continuously compared by comparator 48. When a match occurs, a "found" signal is generated and the double pole, double throw select relay 36 is thrown.

The digitized station frequency associated with a particular ID is then applied to the tuner 30a such that the radio receiver 30b is tuned to the desired stations. The speaker 32 broadcasts to the listener the desired previously stored audio segment. In this way, the listener can hear his favorite song which he had previously selected when he hit the "remember" button 22. Power level change 20b determines when the song is complete, and then the tuner 30a retunes receiver 30b to the prior station. When a selected song is being played by the system, the CPU 10 prevents any additional searching for that song on that station until the song is complete.

In Mode 1 previously described, the listener had to quickly push the "remember" button 22 when he heard a song he desired to remember. In Mode 2 of operation, the analysis section 20 is continually analyzing the output of the station being listened to and the voting logic is applying detected ID's from the data reduction circuit 56 to the formatter 52. The file server is then continuously supplying a series of ID's to the scratch pad memory 44. The ID's are temporarily stored in the scratch pad memory 44 and "ripple through" the memory. If the "remember" button 22 is not depressed during the time the temporarily stored ID's are "rippling through" the scratch pad memory 44, then the temporarily stored ID's are lost. If, however, the "remember" button 22 is depressed within a predetermined time interval, such as thirty seconds since the occurrence of the ID, then the ID is transferred for permanent storage in the "to be found" library memory 46. The system then continues to operate thereafter in the same way as previously described in order to play the stored desired memory segment whenever the stored ID occurs on any station within range of the broadcast receiver. In this mode, the listener may hit the "remember" button near the end of a song and still be able to store its ID in the permanent memory 46.

In the above-described Mode 2, only the ID's occurring on the station listened to are temporarily stored in scratch pad memory 44. Therefore, if the listener turns to another station and finds a desired song near its end, he will not be able to store the ID for that song. Mode 3 of operation of the system eliminates this disadvantage. In Mode 3 of operation, the time multiplex control 50 continuously multiplexes all stations within range of the broadcast receiver by operation of the RTR tuner 18a, as in search mode previously described. In this instance, the multiplexed ID's generated from the voting logic 54 are applied through the data reduction circuit 56 and through the formatter 52 for temporary storage in the scratch pad memory 44. In this mode, ID's from a plurality of stations are then continuously "rippling through" the scratch pad memory 44. If the listener then turns to any station and finds a song in progress, he need only hit the "remember" button 22 and the temporarily stored ID for that particular station which last occurred is transferred to the "to be found" library memory 46 for permanent storage as an ID. Thereafter, whenever any radio station plays a song containing the stored ID, that song will be broadcast over the speaker 32.

In each of the temporary stored ID's in the scratch pad memory 44 not only the ID, but a digital indication of the station and the time, are stored. This information is utilized by the comparator 48 in order to provide a priority scheme to play only the most highly desired song in case of simultaneous or concurrent playing of songs on different stations. The station ID, previously noted, is utilized by the CPU in order to tune the manual tuner 30a to the desired station on which an ID has just occurred.

Whenever it is desired to erase the stored memories, the "erase" button 24 is depressed and the memory of the "to be found" library memory 46 is erased.

Figure 5:
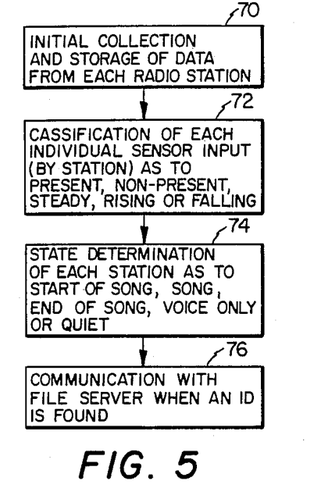
FIGS. 5–9 are flow charts illustrating the operation of the CPU of the present invention.

FIGS. 5–9 are flow charts which illustrate the operation of the CPU 10 of the present invention. Referring to FIG. 5, the four basic operation routines of the CPU are illustrated. Program 70 provides for the initial collection and storage of data from each radio station in response to the continuous multiplexing provided by the time multiplex controller 50. Routine 72 provides classification of each individual sensor unit in the analysis section 20, by station, with regard to whether the particular parameter is present, not present, steady, rising or falling. For example, routine 72 determines whether or not the output of the power monitor 21h is present, not present, steady, rising or falling. Route 74 determines the state with regard to each station for each multiplexed time segment as to start of song, existence of song, end of song, voice only or quiet. Routine 76 provides communication with the file server 40 when an ID is determined.

Figure 6:
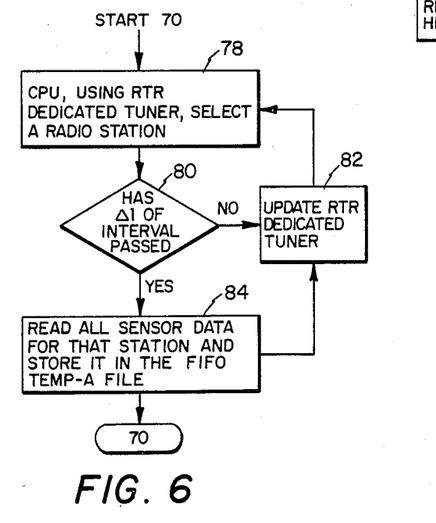

FIG. 6 illustrates routine 70 in more detail. It will be understood that routines 70–76 operate asynchronously. Route 70 is initiated and, at 78 the CPU 10 selects a radio station by utilizing the RTR dedicated tuner 18. At 80, the determination is made as to whether one of the predetermined time intervals of the system has passed. In the preferred embodiment, a time interval of approximately 50 milliseconds will be utilized. If the time interval has not passed, the dedicated tuner 18 is updated at 82 and step 78 is repeated. If the interval has passed, at 84 the sensor data from the analog section 20 is read for that particular station and is stored in a first in/first out (FIFO) temporary file within the CPU 10.

It will thus be seen that routine 70 causes a plurality of sensor outputs to be stored for each multiplexed station for each of the fifty millisecond time intervals during operation of the system.

Figure 7:
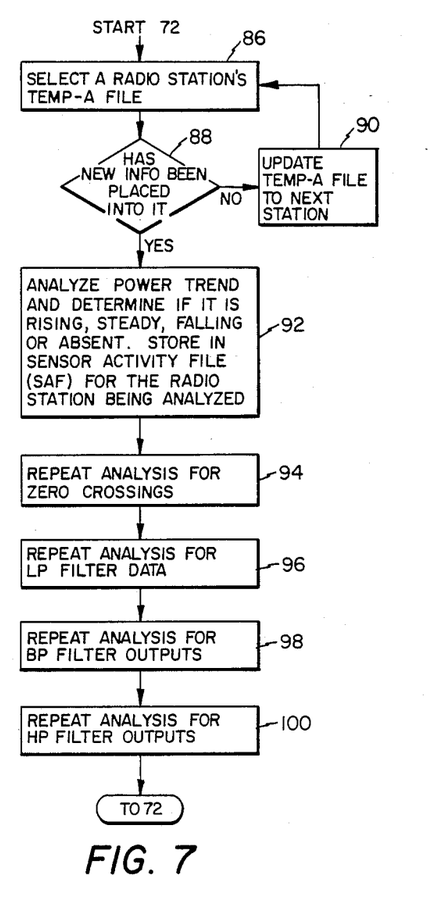

FIG. 7 illustrates additional detail of the operation of the routine 72. At step 86, the stored sensor outputs for a particular time interval for a selected radio station are selected. At step 88, a determination is made as to whether new information has been placed into the particular selected file. If not, the particular file is updated at 90 to go to the parameters stored for the next multiplexed station. If new information has been placed in the particular file being reviewed, the power trend for that particular stored data is analyzed at 92. At 92, the power trend is analyzed and it is determined if the power trend is rising, steady, falling or absent. The results of analyzation are stored in a sensor activity file (SAF) within the CPU 10. The particular analyzed data is stored in a SAF for the particular radio station being analyzed for the particular time interval. At 94, an analysis is made of the stored zero crossings which have been stored for that particular radio station for that particular time interval. The analyzed zero crossing information is stored in the SAF file.

At 96, the low pass filter data from the low pass filter 21c is analyzed to determine if it is rising, steady, falling or absent, and the resulting information is stored in the particular SAF file within the CPU 10. Similarly, at 98 the output from the bandpass filters 21d–21g are analyzed to determine if they are rising, steady, falling or absent and the resultant information is stored in the SAF filter memory. The same analysis is performed on the high pass filter 21 output and the resulting information is stored in the SAF memory. It will be understood that within a particular SAF memory, a large amount of information is stored with respect to each multiplexed time interval for each particular radio station. This information is then utilized by the CPU to determine whether or not the information represents a start of a song, an actual song being played, an end of song, voice only or silence.

Figure 8:
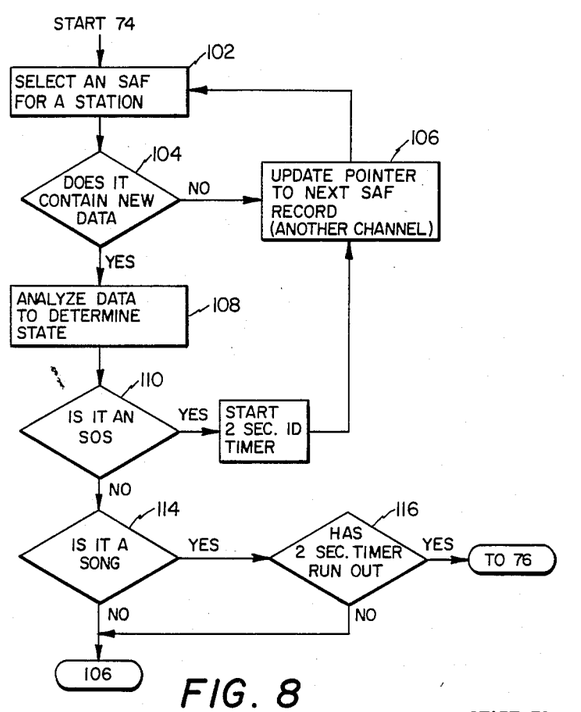

This determination is made by routine 74 which is illustrated in FIG. 8. This routine is begun at 102 wherein an SAF is selected for a particular station. The decision is made at 104 as to whether or not the SAF contains new data not previously considered. If not, the pointer is updated at 106 to the next SAF record for another station and the process is repeated. If the SAF does contain new data, this data is analyzed at 108 to determine its state.

The state of the data is determined by predetermined voting logic stored within the CPU 10. For example, if the power is rising from a previous quiet position, the zero crossing is changing, the low pass filter is changing and the remaining bandpass filters are present, this is an indication of a start of song. Similarly, if the power is steady, the zero crossing indications are steady, the low pass filter output is steady and the remaining bandpass filters are present, this is an indication of the existence of a present song.

If the power is decreasing into a quiet level, the zero crossings are changing, the low pass filter outputs are changing and the remaining bandpass filters are present, this is an indication of an end of song. If the power is steady, the zero crossings are steady, the low pass filter outputs are not present, and the remaining bandpass filters are present, this is an indication of voice. If no outputs are detected from the zero crossing, the bandpass filters and the low pass filter, this is an indication of silence and no song or voice being played.

Figure 9:
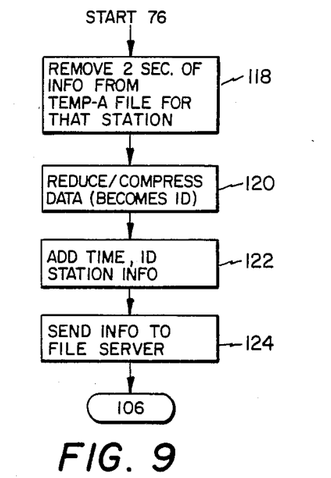

A determination is made at 110 as to whether or not the state is a start of song. If so, a two second identification timer is begun at 112 and step 106 repeated. If not, a determination is made at 114 as to whether or not the state is a song currently being played. If yes, a determination is made at 116 as to whether or not the two second timer has run out. If yes, the system program goes to the start of routine 76 as shown in FIG. 9. If a negative determination is made at step 114 or 116, the routine returns to step 106.

FIG. 9 illustrates in greater detail the routine 76 which provides communications with the file server when an ID is found. The routine is initiated at step 118 wherein two seconds of information is removed from the temporary file within the CPU for the particular station in which a song is playing. At 120, the data is reduced and compressed in order to become an ID representation. At 122, the time, ID, number and station information is added to the compressed data. At 124, the information is transmitted to the file server 40 as previously explained in FIG. 2. The system then returns to step 106 for reiteration.

It will thus be understood that the present system provides a technique for allowing a listener of a broadcast receiver to hear a desired audio segment without continuous manual searching of the dial. Whenever a desired audio segment is detected by the system, it is automatically played over the speaker so that the listener can listen to his favorite music, news, sports or other audio information.

Whereas the present invention has been described with respect to specific embodiments thereof, it will be understood that the invention is capable of numerous rearrangements, modifications and substitutions of parts without departing from the spirit of the invention.

I claim:

1. A method for detecting and playing desired audio segments over a broadcast receiver comprising:

selecting and storing representations of a first portion of a plurality of desired audio segments being broadcast on a plurality of stations being received by the receiver;

detecting the occurrence of an audio portion that corresponds to one of said stored first portions on one of the plurality of stations being received by the receiver;

switching the receiver to the station upon which the corresponding audio portion is detected, and broadcasting the remaining portion of the audio segment on the station over the receiver.

2. The method of claim 1 wherein the occurrence of one of said desired audio segments is detected on any of said plurality of stations being received by the receiver.

3. The method of claim 1 wherein the listener may select and store a representation of an audio segment currently being broadcast on a station.

4. The method of claim 1 wherein the listener may select and store a representation of an audio segment previously broadcast on a station within a predetermined time interval.

5. A method for detecting and playing desired audio segments over a broadcast receiver comprising:

receiving and broadcasting audio programs from any of a plurality of different stations over a broadcast receiver;

enabling the listener to select a representative portion of the desired audio segments played over the broadcast receiver;

storing digital representations of said selected representative portions;

scanning the audio programs being broadcast by said plurality of different stations;

comparing said stored digital representations with the audio programs being scanned, a valid comparison indicating the presence of the one of said desired audio segments; and playing the remaining portion of said desired audio segments over the broadcast receiver.

6. The method of claim 5 wherein the listener may select and store a digital representations of a representative portion of an audio segment currently being broadcast on a station.

7. The method of claim 5 wherein the listener may select and store a digital representations of a representative portion of an audio segment previously broadcast on a station within a predetermined time interval.

8. The method of claim 5 and further comprising:

tuning the broadcast receiver to a dedicated one of the plurality of stations and broadcasting the audio thereon during scanning of the plurality of stations; and returning the broadcast receiver to the dedicated station after the desired audio segment has been broadcast.

9. The method of claim 5 wherein said digital representations of said representative portions of said selected audio segments comprise indications of the frequency spectrum of said audio segments.

10. The method of claim 5 wherein said digital representations of said representative portions of said selected audio segments comprise indications of the power level of said audio segments.

11. Apparatus for being coupled with a broadcast receiver for detecting and playing desired audio segments comprising:

means coupled to the receiver for enabling the listener to select desired audio segments;

means for storing representations of a first portion of the desired audio segments;

means for detecting the occurrence of an audio segment that corresponds to one of said stored first portions on one of a plurality of stations being received by the receiver, a valid detection indicating the presence of one of said desired audio segments; and means responsive to said detecting means for broadcasting the remaining portion of said desired audio segment over the receiver.

12. The apparatus of claim 11 wherein said means for enabling the listener to select comprises switch means for operation during the broadcast of the desired audio segment.

13. The apparatus of claim 11 wherein said means for enabling the listener to select comprises switch means for operation within a predetermined time period after the broadcast of the desired audio segment.

14. The apparatus of claim 11 and further comprising:

a dedicated tuner and receiver for scanning said plurality of stations being received by the receiver, the output of said receiver being applied to said means for detecting.

15. The apparatus of claim 11 wherein said representations of said first portion comprise indications of the frequency spectrum of said audio segments.

16. The apparatus of claim 11 wherein said representations of said first portion comprise indications of the power level of said audio segments.

17. Apparatus for detecting and playing desired audio segments comprising:

a broadcast receiver for receiving and broadcasting audio programs from a plurality of different stations;

means coupled with said broadcast receiver for enabling the listener to select desired audio segments;

means for storing representations of initial portions of said selected desired audio segments;

means for scanning the audio being broadcast by said plurality of different stations;

means for comparing said stored representations with the audio scanned by said scanning means, a valid comparison indicating the presence of one of said desired audio segments; and means responsive to said comparing means for playing the remaining portion of the corresponding one of said desired audio segments over said broadcast receiver upon occurrence of a valid comparison on any of said plurality of different stations.

18. The apparatus of claim 17 wherein said desired audio segment comprises a musical composition.

19. The apparatus defined in claim 17 wherein said means for enabling the listener comprises:

switch means operable by the listener in order to detect and store representations of an initial portion of a desired audio segment currently being played over the radio being listened to by the listener.

20. The apparatus of claim 19 wherein said means for enabling the listener further comprises:

means for storing representations an initial portion of the audio segment which occurs after the initiation of said switch means by the listener.

21. The apparatus of claim 19 wherein said means for enabling the listener further comprises:

means for temporarily storing representations of all audio being broadcast by a selected station; and means for storing as said representations of the initial portion the representations of the portion of the audio played a predetermined time interval before the initiation of said switch means by the listener.

22. The apparatus of claim 19 wherein said means for enabling the listener comprises:

means for scanning the audio on all of a plurality of stations being received by the receiver;

means for temporarily storing representations of the audio played by all scanned stations; and means for storing as said representations of the initial portions the representations of the stored audio for a particular radio station being listened to prior to the initiation of said switch means by the listener.

23. The apparatus of claim 17 and further comprising:

second storage means for temporarily storing representations of the initial portion of audio segments prior to storage as selected audio segments by the listener.

24. The apparatus of claim 17 wherein said representations of the initial portion comprise indications of the frequency spectrum of said audio segments.

25. The apparatus of claim 17 wherein said representations of the initial portions comprise indications of the power level of said audio segments.

26. The apparatus of claim 17 and further comprising:

a dedicated tuner and receiver for scanning said plurality of stations being received by the receiver, the output of said receiver being applied to said means for detecting.

27. The apparatus of claim 17 and further comprising:
means for retuning said broadcast receiver back to the original station after playing of a desired audio segment.

28. A method for detecting and playing desired audio segments over a broadcast receiver, comprising:
selecting and storing a representative portion of each of the desired audio segments,
sampling the output of each of a plurality of stations being received by the receiver;
comparing the sampled output of each of the plurality of stations with a select one of the stored representative portions, a valid comparison indicating the presence of the corresponding one of said desired audio segments;
selecting the station on which the valid comparison was made in response to the valid comparison; and
broadcasting the remaining portion of the audio segment over the broadcast receiver, the remaining portion being that portion of the desired audio segment occuring after the station has been selected.

29. The method of claim 28 wherein each of the stored representative portions are prioritized such that the higher priority one of the stored representative portions governs the selection of the station in the event of two simultaneous valid comparisons.

30. The method of claim 28 wherein a broadcast receiver is dedicated to one of the plurality of stations and the audio output therefrom is broadcast over the receiver during sampling.

31. The method of claim 30 and further comprising sensing the end of the desired audio segment being broadcast after selection of the station in response to a valid comparison and switching back to the dedicated one of the plurality of stations.

32. The method of claim 31 wherein the desired audio segments comprise music.

* * * * *

UNITED STATES PATENT AND TRADEMARK OFFICE
CERTIFICATE OF CORRECTION

PATENT NO. : 4,499,601
DATED : February 12, 1985
INVENTOR(S) : Gordon H. Matthews It is certified that error appears in the above—identified patent and that said Letters Patent is hereby corrected as shown below:

Col. 11, line 12, Claim 6, line 2, "select and store a digital representations of a" should be --select and store digital representations of a--;

line 17, Claim 7, line 2, "select and store a digital representations of a" should be --select and store digital representations of a--.

Col. 12, line 34, Claim 20, line 3, "means for storing representations an initial portion of" should be --means for storing representations of an initial portion of--.

Signed and Sealed this

Twenty-third Day of July 1985

[SEAL]

Attest:

DONALD J. QUIGG

Attesting Officer

Acting Commissioner of Patents and Trademarks